(12) United States Patent
Chen et al.

(10) Patent No.: US 8,835,277 B2
(45) Date of Patent: Sep. 16, 2014

(54) METHOD TO IMPROVE CHARGE TRAP FLASH MEMORY CORE CELL PERFORMANCE AND RELIABILITY

(71) Applicant: Spansion LLC, Sunnyvale, CA (US)

(72) Inventors: Tung-Sheng Chen, Cupertino, CA (US); Shenqing Fang, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 110 days.

(21) Appl. No.: 13/680,726

(22) Filed: Nov. 19, 2012

(65) Prior Publication Data

US 2014/0141591 A1 May 22, 2014

(51) Int. Cl.
*H01L 21/76* (2006.01)
*H01L 21/762* (2006.01)

(52) U.S. Cl.
CPC .................................. *H01L 21/762* (2013.01)
USPC .......................................... 438/404; 257/499

(58) Field of Classification Search
USPC ....................................................... 438/404
See application file for complete search history.

(56) References Cited

U.S. PATENT DOCUMENTS

2005/0045966 A1 3/2005 Yamashita et al.
2007/0004139 A1 1/2007 Kim et al.
2007/0026675 A1* 2/2007 Kim et al. ..................... 438/689
2008/0277712 A1* 11/2008 Ding et al. .................... 257/315
2010/0038701 A1 2/2010 Bhattacharyya

FOREIGN PATENT DOCUMENTS

KR 10-2011-0077715 A 7/2011
KR 10-2012-0026313 * 3/2012
KR 10 2012-0026313 A 3/2012

OTHER PUBLICATIONS

International Search Report and Written Opinion of the International Searching Authority for International Application No. PCT/US2013/070579, mailed Feb. 26, 2014.
English language abstract for Korean Patent Application Publication No. KR-10-2012-0026313-A.
English language abstract for Korean Patent Application Publication No. KR-10-2011-0077715-A.

* cited by examiner

*Primary Examiner* — Lex Malsawma
*Assistant Examiner* — Geoffrey Ida
(74) *Attorney, Agent, or Firm* — Sterne, Kessler, Goldstein & Fox P.L.L.C.

(57) ABSTRACT

A semiconductor processing method to provide a high quality bottom oxide layer and top oxide layer in a charged-trapping NAND and NOR flash memory. Both the bottom oxide layer and the top oxide layer of NAND and NOR flash memory determines array device performance and reliability. The method describes overcomes the corner thinning issue and the poor top oxide quality that results from the traditional oxidation approach of using pre-deposited silicon-rich nitride.

21 Claims, 6 Drawing Sheets

METHOD TO IMPROVE CHARGE TRAP FLASH MEMORY CORE CELL PERFORMANCE AND RELIABILITY

BACKGROUND

1. Field

This invention relates generally to memory fabrication, and more particularly to a semiconductor processing method for flash memory fabrication.

2. Background Art

The semiconductor market has been undergoing extensive growth over the past few decades. This trend is expected to continue for the foreseeable future since a large portion of this market is the memory segment. The memory segment can be broadly categorized into two classes, namely volatile memory and non-volatile memory. Volatile memory such as SRAM and DRAM lose their data content when the power supply is removed. In contrast, non-volatile memories such as EEPROM and flash memories maintain their data content after the power supply has been removed.

Non-volatile memories offer particular advantages, and thereby support a wide range of applications including computer, automotive and consumer electronic devices. Flash memory is a non-voltage memory that can be electrically erased and reprogrammed. In fact, flash memory has undergone an explosive market growth that has in particular been driven by cellular telephones, memory cards, flash drives and other types of portable data storage devices. Indeed, with the need to support persistent data storage in portable devices, it is clear that the flash memory will continue to grow at an ever increasing rate. Further, the market place will demand flash memory designs that support lower cost and higher performance, including higher densities of storage.

The basic concept of a charge trap flash memory cell is that of a charge trap layer in a semiconductor transistor. The electrical isolation of the charge trap layer is accomplished by surrounding it with dielectric material, such as an oxide. Typically, charge trap flash memory cells use two oxide layers, a "bottom" oxide layer and a "top" oxide layer. The top oxide layer in a flash memory cell plays a key role in determining flash memory cell performance and reliability.

BRIEF SUMMARY

Degraded flash memory cell performance can result from top oxide issues such as "corner thinning" and poor quality. What is needed is a processing approach by which the top oxide layer can be manufactured while maintaining satisfactory flash memory cell performance and reliability.

In one embodiment, a fabrication method includes forming a tunneling dielectric layer is also formed on the substrate, followed by a charge trapping layer. A plurality of trench isolation regions are formed through the tunneling dielectric layer and the charge trapping layer. A blocking dielectric layer is then formed, followed by oxidization of the blocking dielectric layer. Finally, a polysilicon region is then formed on the blocking dielectric layer.

In another embodiment, a fabrication method includes forming a tunneling dielectric layer is also formed on the substrate, followed by a charge trapping layer. A plurality of trench isolation regions are formed through the tunneling dielectric layer and the charge trapping layer. A blocking dielectric layer is formed, followed by a sacrificial layer. Planarization material is disposed on the sacrificial layer to at least the height of the mesas of the trench isolation regions. Next, a portion of the planarization material is etched back and the nitride layer on the mesa is etched away, followed by removal of the sacrificial layer. Oxidization of the blocking dielectric layer then takes place, which results in the final material for the blocking dielectric layer. Finally, a polysilicon region is then formed on the blocking dielectric layer.

The features and advantages of the current invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing, in which an element first appears is indicated by the leftmost digit(s) in the corresponding reference number.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
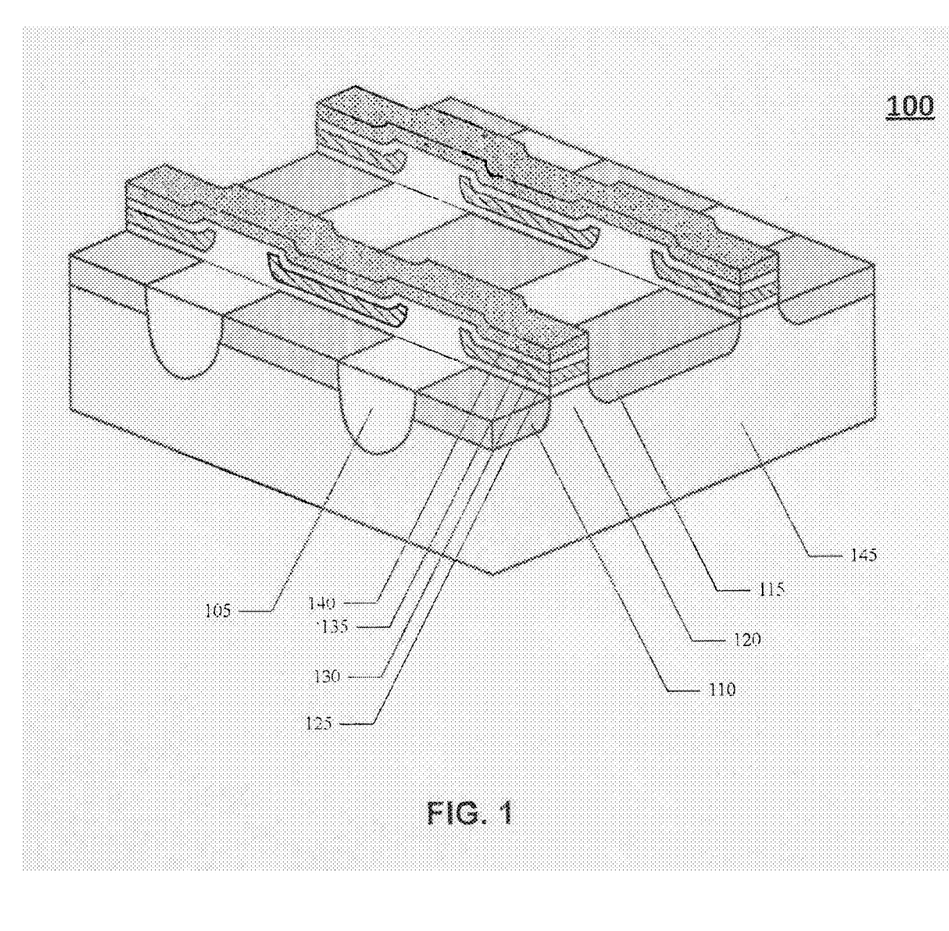
FIG. 1 illustrates a block diagram of a memory cell array structure, in accordance with an embodiment of the current invention.

FIG. 1 illustrates a block diagram of a memory cell array structure, in accordance with an embodiment of the current invention. Referring to FIG. 1, a memory cell array may be a charge-trapping NAND (CT-NAND) memory cell array 100. However, it is noted that embodiments of the present technology may be applied to any charge-trapping FET (CT-FET) device. For example, embodiments of the present invention apply to both NAND as well as NOR flash memory cell arrays. In one implementation, each column of CT-FETs may be separated by a shallow trench isolation (STI) region 105. Each CT-FET may include a drain region 110, a source region 115, a channel region 120, a tunneling dielectric layer 125 (also commonly referred to as a bottom dielectric layer), a charge trapping layer 130, a blocking dielectric layer 135 (also commonly referred to as a top dielectric layer), and a gate region 140. The source and drain regions 110, 115 may be semiconductor regions of the substrate 145 having a heavy doping concentration of a first type of impurity. In one implementation, the source and drain regions 110, 115 may be silicon heavily doped with phosphorous, arsenic, or both. Persons of ordinary skill in the relevant arts will also recognize alternative materials can also be used, and fall within the scope of the current invention. The channel region 120 may be a semiconductor region of the substrate 145 having moderate doping concentration of a second type of impurity, disposed laterally between the source and drain regions 110, 115. In one implementation, the channel region 120 may be silicon moderately doped with boron. The tunneling dielectric layer 125 may be a dielectric layer disposed over the channel region 120 and adjacent portions of the source and drain regions 110, 115. In one implementation, the tunneling dielectric layer 125 may be silicon dioxide, oxynitride, silicon oxynitride, or the like layer. The charge trapping layer 130 may be a dielectric, semiconductor or the like layer disposed between the tunneling dielectric layer 125 and the blocking dielectric layer 135. In one implementation, the charge trapping layer 130 may be a nitride, silicon-rich-nitride, or the like layer. The blocking dielectric layer 135 may be a dielectric layer disposed between the charge trapping layer 130 and the gate region 140. In one implementation, the blocking dielectric layer 135 may be a silicon dioxide, oxynitride, silicon oxynitride, or the like layer. The gate region 140 may be a semiconductor or a conductor layer disposed on the blocking dielectric layer 135 opposite the charge trapping layer 130. In one implementation, the gate region 140 may be a polysilicon layer having a heavy doping concentration of the first type or second type of impurity.

Figure 2A:
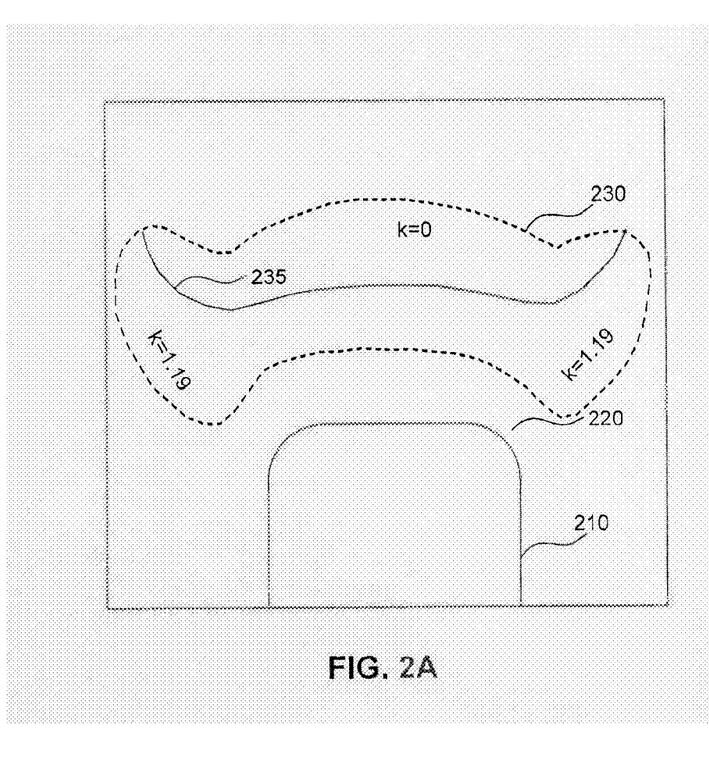
FIGS. 2A and 2B illustrates a top oxide layer of a memory cell array structure using a standard fabrication process.
Figure 2B:
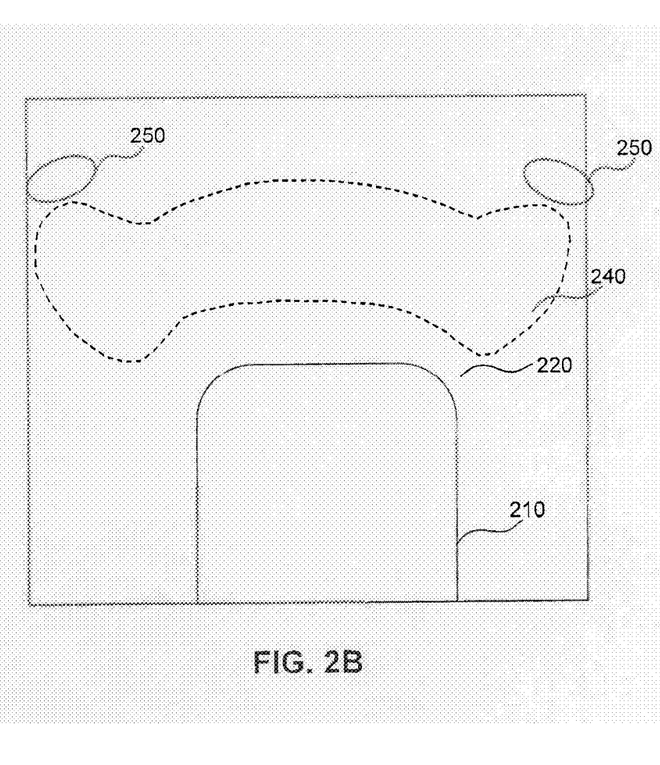

As noted above, degraded flash memory cell performance can result from top oxide issues such as "corner thinning" and poor quality. FIGS. 2A and 2B illustrate potential areas of concern for poor quality in the traditional process. Referring to FIG. 2A, the source-drain pillar 210 is illustrated with the bottom oxide layer 220 shown on top. A composite nitride layer 230 forms the starting point for the charge trapping layer. Composite nitride layer 230 can be fabricated as a silicon-rich nitride sub-layer together with standard silicon nitride layer. As shown in FIG. 2A, the silicon-rich nitride sub-layer has a coefficient of extinction (k) of 1.19, while the standard nitride sub-layer has a coefficient of extinction (k) of 0. For illustration purposes, dividing line 235 divides the silicon-rich nitride sub-layer from the standard silicon nitride layer in FIG. 2A.

FIG. 2B illustrates the same semiconductor structure following the top oxide process step. The composite nitride layer 240 has shrunk as a result of the top oxide process. The standard silicon nitride layer (k=0) produces a high quality top oxide layer The silicon-rich nitride layer (k=1.19) produces a sub-standard top oxide layer. In FIG. 2B, the two circled areas 250 are areas where silicon-rich nitride material has been exposed to the top oxide process step, and thereby a sub-standard top oxide layer has been produced. It is therefore desirable to modify the process flow to avoid this problem.

Figure 3A:
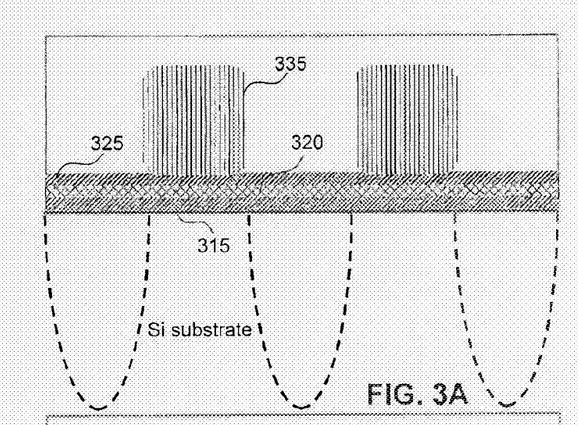
FIGS. 3A through 3C show a flow diagram of a method of fabricating a charge trapping field effect transistor, in accordance with an embodiment of the current invention.
Figure 3B:
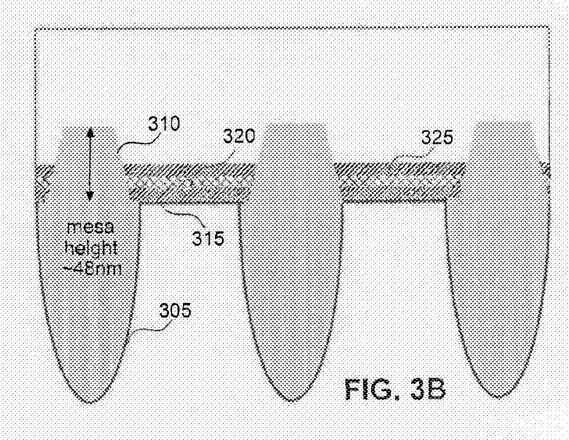
Figure 3C:
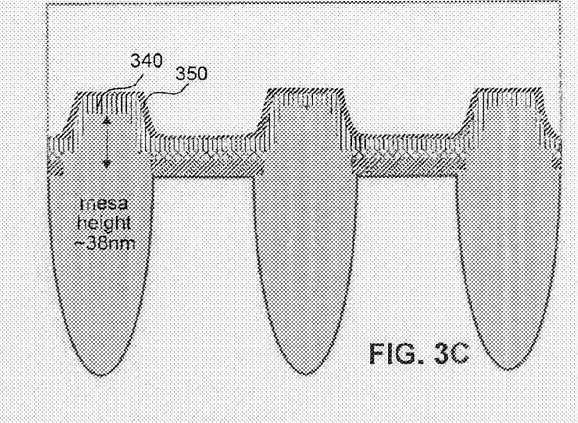

FIGS. 3A through 3C illustrate a semiconductor fabrication process that avoids the problem described in the previous paragraph, in accordance with an embodiment of the current invention. FIG. 3A indicates that the substrate is a silicon substrate, although other semiconductor substrate materials such as germanium, silicon-germanium and the like fall within the scope of the present invention. Referring to FIG. 3A, bottom oxide layer 315 is shown as the first layer in the stack. Bottom oxide layer 315 is an oxide, such as silicon dioxide, and can be formed by a thermal oxidation process. Alternatively, a low pressure chemical vapor deposition (LPCVD) process can be used to form bottom oxide layer 315. A silicon-rich nitride (SiRN) layer 320 is deposited over bottom oxide layer 315, followed by a first high temperature oxide (HTO) layer 325. Silicon-rich nitride layer 320 can be formed by chemical vapor deposition, or other suitable deposition technique. First HTO layer 325 functions as a sacrificial oxide layer, and can be formed by suitable techniques such as thermal oxidation or low pressure chemical vapor deposition (LPCVD) at the appropriate temperature and pressure levels. A silicon nitride cap 335 is formed on top of the first HTO layer 325, with silicon nitride cap 335 providing a protective cap for subsequent fabrication steps. Silicon nitride cap 335 provides a pattern that is synchronized to the cells to be fabricated using this process. In an exemplary embodiment, silicon nitride cap 335 can be formed by chemical vapor deposition, or other suitable deposition technique, with the patterning performed by suitable lithography techniques.

In an exemplary embodiment, the bottom oxide layer 315 is approximately 6 nm in thickness, the silicon-rich nitride layer 320 is approximately 9 nm in thickness, and the first HTO layer 325 is approximately 5 nm in thickness. Silicon nitride cap 335 is approximately 50 nm in thickness, composed of SiN material and, as noted above, forms a hard mask for subsequent fabrication.

Referring to FIG. 3B, using silicon nitride cap 335, isolation trenches 305 with associated mesas 310 are formed using conventional processes, as would be understood by one of ordinary skill in the relevant arts. In such a conventional process, patterning film stack (not shown) is formed on top of silicon nitride cap 335 and used to pattern and etch the isolation trenches 305. Isolation trenches 305 define the active regions of the resulting flash memory device. In an exemplary embodiment of the patterning film stack, amorphous carbon and/or bottom anti-reflective coating (BARC) material can be used to form the patterning film stack. In forming isolation trenches 305 with associated mesas 310, portions of bottom oxide layer 315, silicon-rich nitride layer 320 and first HTO layer 325 can be removed in the regions of isolation trenches 305 and associated mesas 310. In an exemplary process step, portions of bottom oxide layer 315, silicon-rich nitride layer 320 and first HTO layer 325 are removed using a plasma dry etch process or its equivalent. In an exemplary embodiment, isolation trenches 305 are approximately 1500 to 2500 Angstroms deep.

Continuing to describe the isolation trench fabrication process, a liner oxide is next formed on the sidewalls of isolation trenches 305. In an exemplary embodiment, the liner oxide can be composed from silicon dioxide using a thermal oxidation process. The remaining cavity in isolation trenches 305 can be filled by the deposition of filler oxide (e.g., silicon dioxide) using high density plasma chemical vapor deposition (HDPCVD). The filler oxide can then be planarized using, for example, a chemical mechanical polishing (CMP) process. The planarization of the filler oxide stops at the silicon nitride cap 335. Next, silicon nitride cap 335 is removed by an etch process that is specific to the silicon nitride cap material, thereby resulting in the structure illustrated in FIG. 3B. In an exemplary process step, silicon nitride cap can be selectively removed by a hot phosphoric acid application. In an exemplary embodiment, the resulting mesa height is approximately 48 nm.

Referring now to FIG. 3C, the first HTO layer 325 is now removed, as its function of protection of the underlying silicon-rich nitride layer 320 has now been accomplished. In an exemplary process step, a wet etch process can be used, such as application of hydrofluoric acid or its equivalent. Thus, in an exemplary embodiment, removal of the first HTO layer 325 can result in a small reduction of the mesa height being collaterally removed. Thus, in removing first HTO layer 325, the mesa height is reduced to approximately 38 nm. Next, a standard silicon nitride (SiN) layer 340 is overlaid on top of the device, with the silicon nitride layer 340 being a continuous layer. By contrast, the underlying silicon-rich nitride layer 320 is formed only over the active regions of the flash memory cells. By forming the SiRN layer 320 and the SiN layer 340 in the manner described, the SiRN layer 320 is not exposed and cannot thereby form poor quality oxides. Next, a top oxide layer 350 is formed on top of the silicon nitride layer 340 by converting a top portion of the silicon nitride layer 340 using an oxide formation process. In an exemplary embodiment, the resulting standard silicon nitride layer 340 is approximately 4 nm thick, and the resulting top oxide layer 350 is approximately 5-9 nm thick.

Finally, a polysilicon layer (not shown) is formed on the top oxide layer 350.

Figure 4:
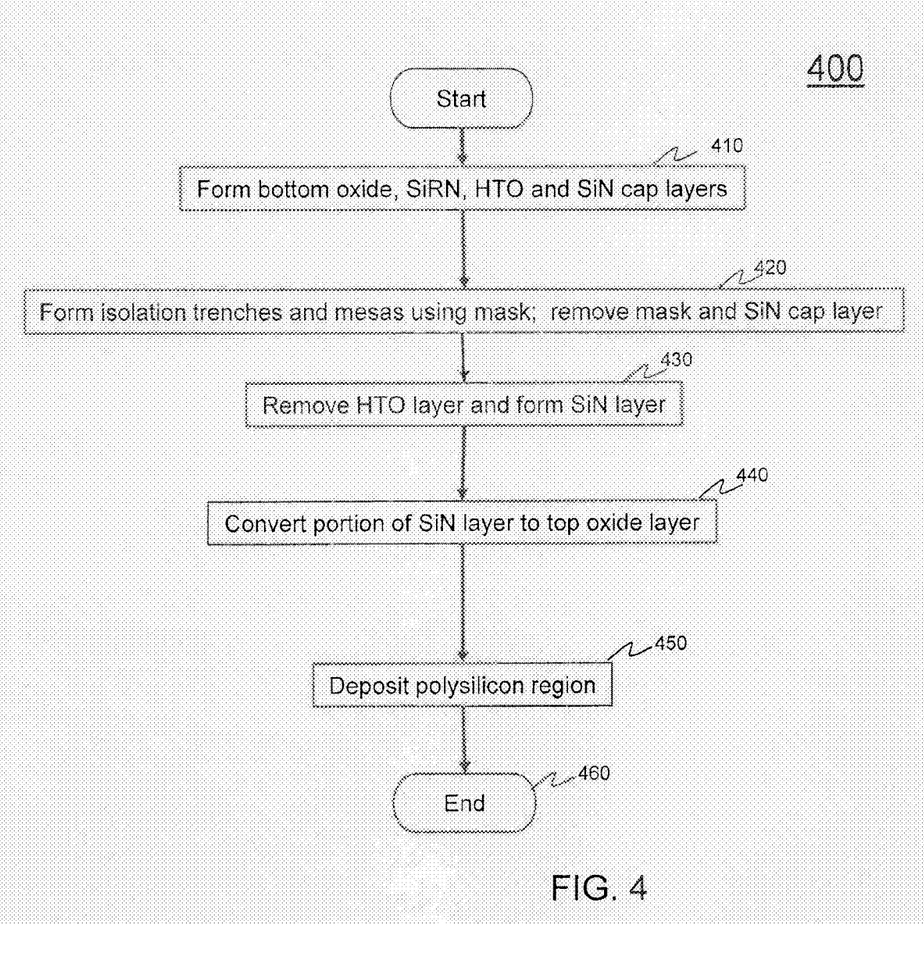
FIG. 4 provides a flowchart of a method that fabricates a memory flash memory cell structure with improved core cell performance, according to an embodiment of the current invention.

FIG. 4 provides a flowchart of a method that fabricates a memory flash memory cell structure using a self-aligned SiRN layer and cap SiN, according to an embodiment of the current invention.

The process begins at step 410. In step 410, bottom oxide layer 315, SiRN layer 320, HTO layer 325 and silicon nitride cap layer 335 are formed. A patterning, film stack is also formed on top of silicon nitride cap layer 335.

In step 420, isolation trenches 305 and associated mesas 310 are formed based on the pattern of the patterning film stack. Patterning film stack and silicon nitride cap layer 335 are then removed.

In step 430, the HTO layer 325 is removed, and a standard silicon nitride continuous layer 340 is formed.

In step 440, a top portion of the SiN layer 340 is converted to top oxide layer 350.

In step 450, a polysilicon layer is formed on top oxide layer 350.

At step 460, method 400 ends.

Figure 5A:
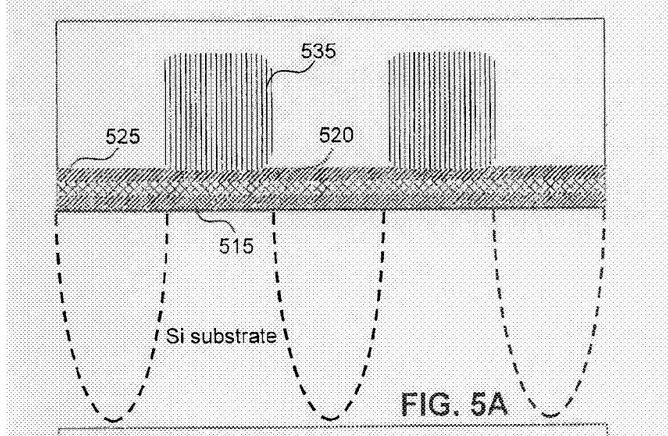
FIGS. 5A through 5D show a flow diagram of a method of fabricating a charge trapping field effect transistor, in accordance with an embodiment of the current invention.

FIGS. 5A through 5D illustrate a second semiconductor fabrication process that also avoids the problem described earlier, in accordance with an embodiment of the current invention. FIG. 5A indicates that the substrate is a silicon substrate, although other semiconductor substrate materials such as germanium, silicon-germanium and the like fall within the scope of the present invention. Referring to FIG. 5A, bottom oxide layer 515 is shown as the first layer in the stack. Bottom oxide layer 515 is an oxide, such as silicon dioxide, and can be formed by a thermal oxidation process. Alternatively, a low pressure chemical vapor deposition (LPCVD) process can be used to form bottom oxide layer 515. A silicon-rich nitride (SiRN) layer 520 is deposited over bottom oxide layer 515, followed by a first high temperature oxide (HTO) layer 525. Silicon-rich nitride layer 520 can be formed by chemical vapor deposition, or other suitable deposition technique. First HTO layer 525 functions as a sacrificial oxide layer, and can be formed by suitable techniques such as thermal oxidation or low pressure chemical vapor deposition (LPCVD) at the appropriate temperature and pressure levels. A silicon nitride cap 535 is formed on top of the first HTO layer 525, with silicon nitride cap 535 providing a protective cap for subsequent etching processes. Silicon nitride cap 535 provides a pattern that is synchronized to the cells to be fabricated using this process. In an exemplary embodiment, silicon nitride cap 535 can be formed by chemical vapor deposition, or other suitable deposition technique, with the patterning performed by suitable lithography techniques.

In an exemplary embodiment, the bottom oxide layer 515 is approximately 6 nm in thickness, the silicon-rich nitride layer 520 is approximately 9 nm in thickness, and the first HTO layer 525 is approximately 5 nm in thickness. Silicon nitride cap 535 is approximately 50 nm in thickness, composed of SiN material and, as noted above, forms a hard mask for subsequent fabrication.

Figure 5B:
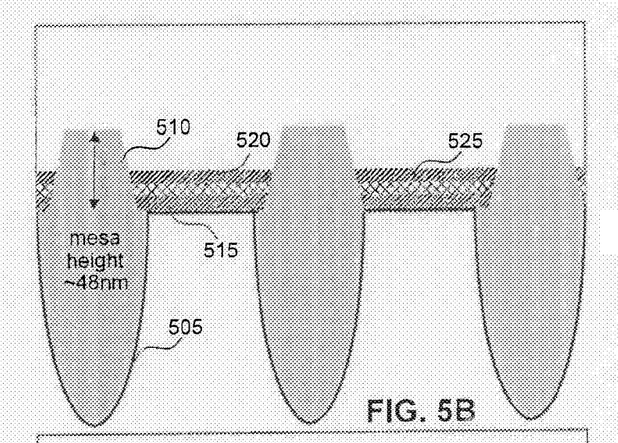

Referring to FIG. 5B, using silicon nitride cap 535, isolation trenches 505 with associated mesas 510 are formed using conventional processes, as would be understood by one of ordinary skill in the relevant arts. In such a conventional process, a patterning film stack (not shown) is formed on top of silicon nitride cap 535 and used to pattern and etch the isolation trenches 505. Isolation trenches 505 define the active regions of the resulting flash memory device. In an exemplary embodiment of the patterning film stack, amorphous carbon and/or bottom anti-reflective coating (BARC) material can be used to form the patterning film stack. In forming isolation trenches 505 with associated mesas 510, portions of bottom oxide layer 515, silicon-rich nitride layer 520 and first HTO layer 525 are removed in the regions of isolation trenches 505 and associated mesas 510. In an exemplary process step, portions of bottom oxide layer 515, silicon-rich nitride layer 520 and first HTO layer 525 can be removed using a plasma dry etch process or its equivalent. In an exemplary embodiment, isolation trenches 505 are approximately 1500 to 2500 Angstroms deep.

Continuing to describe the isolation trench fabrication process, a liner oxide is next formed on the sidewalls of isolation trenches 505. In an exemplary embodiment, the liner oxide can be composed from silicon dioxide using a thermal oxidation process. The resulting gap in isolation trenches 505 can be filled by deposition of the filler oxide (e.g., silicon dioxide, high density plasma chemical vapor deposition (HDPCVD), tetraethylorthosilicate (TEOS), high-aspect-ratio process (HARP) oxide and the like). The filler oxide can then be planarized using, for example, a chemical mechanical, polishing (CMP) process. The planarization of the filler oxide stops at the silicon nitride cap 535. Next, silicon nitride cap 535 is removed by an etch process that is specific to the silicon nitride cap 535 material, thereby resulting in the structure illustrated in FIG. 5B. In an exemplary process step, silicon nitride cap 535 can be selectively removed by a hot phosphoric acid application. In an exemplary embodiment, the resulting mesa height is approximately 48 nm.

Figure 5C:
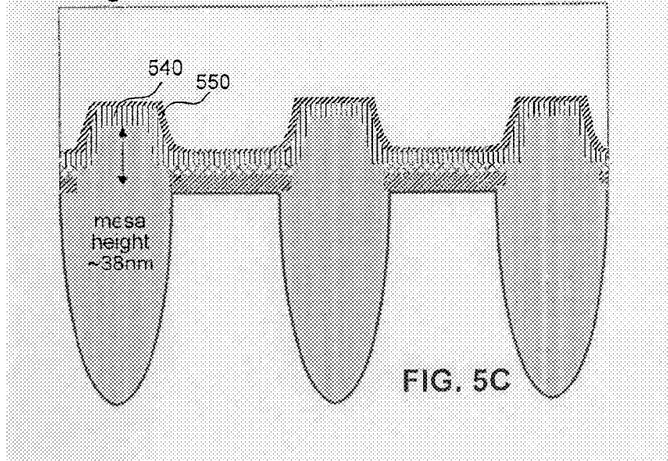

Referring now to FIG. 5C, the first HTO layer 525 is now removed, as its function of protection of the underlying silicon-rich nitride layer 520 has now been accomplished. In an exemplary process step, a wet etch process can be used, such as application of hydrofluoric acid or its equivalent. In removing first HTO layer 525, a small portion of the mesa height may also be removed. Thus, removing first HTO layer 525, the mesa height is reduced to approximately 38 nm in an exemplary embodiment. Next, a standard silicon nitride layer 540 is overlaid on top of the device, with the silicon nitride layer 540 being a continuous layer. By contrast, the underlying silicon-rich nitride layer 320 is formed only over the active regions of the flash memory cells. By forming the SiRN layer 520 and the SiN layer 540 in the fashion shown, the SiRN layer is not exposed and cannot form poor quality oxides, as described above.

Next, on top of the silicon nitride layer 540 is formed a second HTO layer 550, which, like its underlying silicon nitride layer 540, is also continuous. In an exemplary embodiment, the standard silicon nitride layer 540 is approximately 4 nm thick, and the second HTO layer 550 is approximately 2 nm thick.

In the next step, planarization materials are deposited or coated on the second HTO layer 550. Suitable planarization materials can include bottom anti-reflection coating (BARC) material, resist, silicon dioxide and the like. Sufficient planarization materials are deposited so that the planarization level covers the tops of the mesa structures 510. In the next step, the planarization materials are etched back, and then stripped. In the mesa regions, the etching and strip steps not only remove the planarization materials, but also the second HTO layer 550 and silicon nitride layer 540 to thereby expose the filler oxide in the mesas 510 at the top of the trenches. Next, the second HTO layer 550 is removed using a suitable process, such as a wet etch process.

Figure 5D:
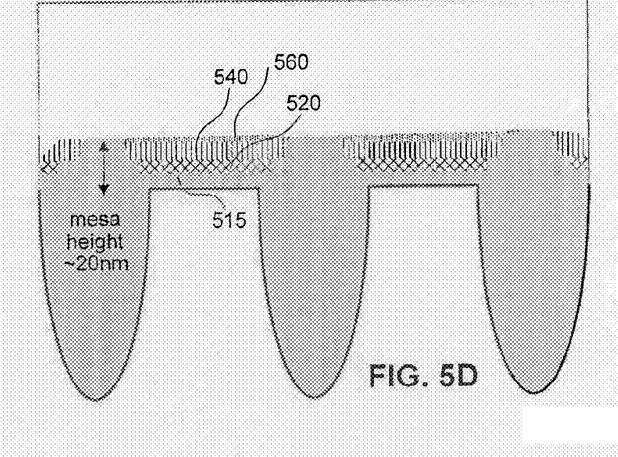

Referring to FIG. 5D, the top oxide layer 560 is formed. In this step, a portion of silicon nitride layer 540, is now converted to silicon dioxide, using conventional processes as would be understood by one of ordinary skill in the arts. Finally, a top layer is formed on the top oxide layer 560, such as a polysilicon layer, to complete this portion of the processing method.

Figure 6:
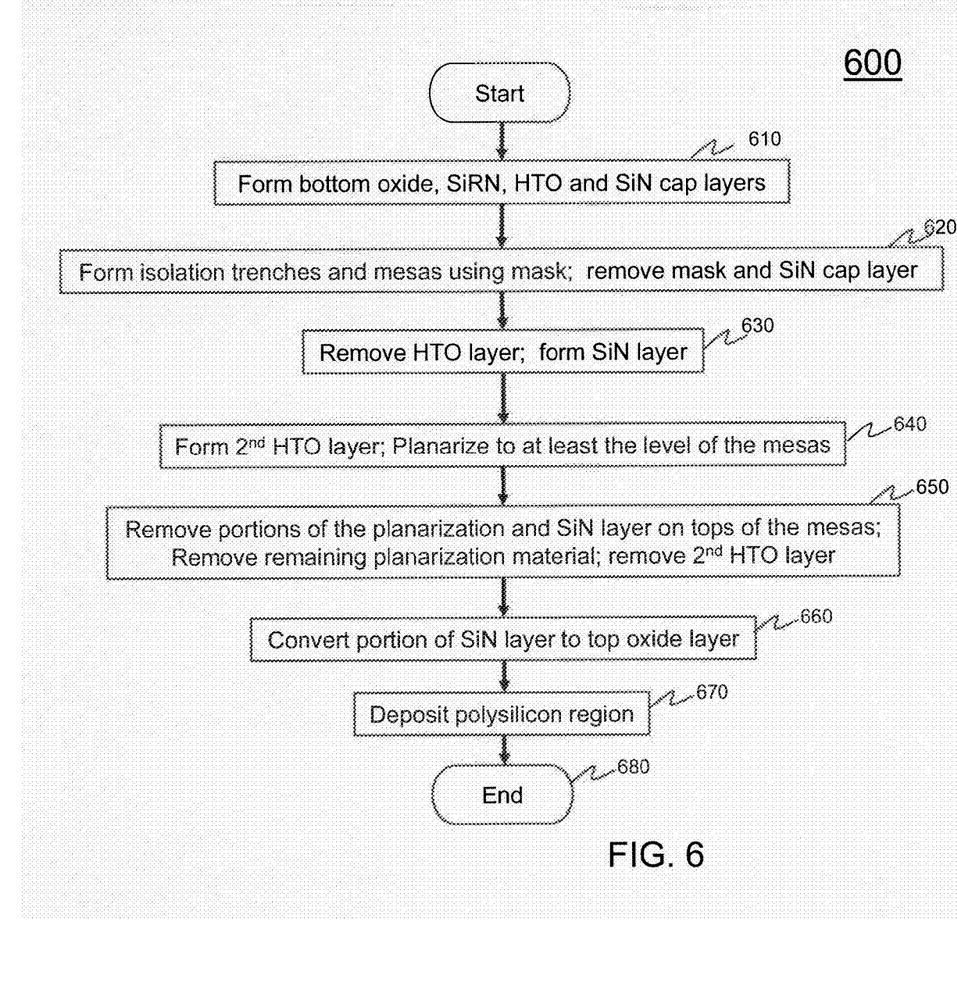
FIG. 6 provides a flowchart of a method that fabricates a memory flash memory cell structure with improved core cell performance, according to an embodiment of the current invention.

FIG. 6 provides a flowchart of a method that fabricates a memory flash memory cell structure using a self-aligned SiRN layer and cap SiN, according to an embodiment of the current invention.

The process begins at step 610. In step 610, bottom oxide layer 515, SiRN layer 520, HTO layer 525 and silicon nitride cap layer 535 are formed. A patterning film stack is also formed on top of silicon nitride cap layer 535.

In step 620, isolation trenches 505 and associated mesas 510 are formed based on the pattern of the patterning film stack. Patterning film stack and silicon nitride cap layer 535 are then removed.

In step 630, the HTO layer 525 is removed, and a standard silicon nitride layer 540 is formed.

In step 640, a second HTO layer is formed, followed by a deposition of planarization materials.

In step 650, the planarization materials are etched back, as well as the mesa portion of the standard silicon nitride layer is etched away, followed by removal of the planarization materials and the second HTO layer.

In step 660, a top portion of the SiN layer 540 is converted to top oxide layer 560.

In step 670, a polysilicon layer is formed on top oxide layer 560.

At step 680, method 600 ends.

As the above discussion indicates, the SiRN layer 520 is used to provide the charge trapping layer 130. The coefficient of extinction (k) is used to characterize the SiRN layer 520. Although the SiRN layer 520 can be a single layer, a composite layer approach can also be used. The bottom of such a composite layer would have a high k (for example, k=1.19) while the top of such a composite layer would have a k value of approximately 0, the value associated with standard SiN material. The choice of the proper value of k represents a compromise between competing factors. For example, a larger k-value results in a faster program/erase cycle, but the resulting device will saturate faster and pose a rougher interface with bottom oxide and a rough interface with the SiN layer. Conversely, a lower k-value results in difficulties in erasure, and in fact a k-value of zero (corresponding to standard SiN material) cannot be erased by electron FN (Fowler-Nordheim) tunneling. Suitable values of k for the SiRN layer can range between 0.9 through 1.19, depending on the other device material choices and dimensions.

It is to be appreciated that the Detailed Description section, and not the Summary and Abstract sections, is intended to be used to interpret the claims. The Summary and Abstract sections may set forth one or more but not all exemplary embodiments of the current invention as contemplated by the inventor(s), and thus, are not intended to limit the current invention and the appended claims in any way.

The current invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the current invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the current invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer, made in the instant application should not be read into or against the parent application.

What is claimed is:
1. A method comprising:
disposing a tunneling dielectric layer on a substrate;
disposing a charge trapping layer on the tunneling dielectric layer;

patterning a plurality of trench isolation regions through the tunneling dielectric layer, and the charge trapping layer, wherein each trench isolation region includes mesas having sidewalls and tops;

disposing a silicon-nitride (SiN) layer over the charge trapping layer and exposed mesas;

oxidizing a portion of the SiN layer to form a blocking dielectric layer on the charge trapping layer; and disposing a polysilicon region on the blocking dielectric layer.

2. The method of claim 1, wherein the tunneling dielectric layer comprises silicon dioxide.

3. The method of claim 1, wherein the charge trapping layer comprises silicon-rich nitride (SiRN).

4. The method of claim 3, wherein the SiRN has an extinction coefficient in the range of approximately 0.9 through 1.19.

5. The method of claim 1, wherein the blocking dielectric layer comprises silicon dioxide.

6. The method of claim 1, wherein the patterning further comprises:
disposing a first sacrificial layer over the charge trapping layer;
disposing a patterning film stack on the first sacrificial layer;
patterning the plurality of trench isolation regions using a dry etch process;
removing the patterning film stack; and
removing the first sacrificial layer.

7. The method of claim 6, wherein the first sacrificial layer comprises a high temperature oxide layer.

8. The method of claim 6, wherein the removing the patterning film stack includes using wet etching.

9. The method of claim 6, wherein the patterning further comprises:
disposing a cap on the first sacrificial layer prior to disposing the patterning film stack; and
removing the cap following the patterning the plurality of trench isolation regions.

10. The method of claim 9, wherein the cap comprises silicon nitride (SiN).

11. A method of forming flash memory, comprising:
disposing a tunneling dielectric layer on a substrate;
disposing a charge trapping layer on the tunneling dielectric layer;
patterning a plurality of trench isolation regions through the tunneling dielectric layer, and the charge trapping layer, wherein each trench isolation region includes mesas having sidewalls and tops;
disposing a silicon-nitride (SiN) layer over the charge trapping layer and exposed mesas;
disposing a first sacrificial layer over the SiN layer;
disposing planarization over the first sacrificial layer to at least a height of the mesas;
removing portions of the planarization and SiN layer on tops of the mesas;
removing remaining planarization and the first sacrificial layer;
oxidizing a remaining portion of the SiN layer to form a blocking dielectric layer on the charge trapping layer; and
disposing a polysilicon region on the blocking dielectric layer.

12. The method of claim 11, wherein the tunneling dielectric layer comprises silicon dioxide.

13. The method of claim 11, wherein the charge trapping layer comprises silicon-rich nitride (SiRN).

14. The method of claim 13, wherein the SiRN has an extinction coefficient in the range of approximately 0.9 through 1.19.

15. The method of claim 11, wherein the blocking dielectric layer comprises silicon dioxide.

16. The method of claim 11, wherein the patterning further comprises:
disposing a second sacrificial layer over the charge trapping layer;
disposing a patterning film stack on the second sacrificial layer;
patterning the plurality of trench isolation regions using a dry etch process;
removing the patterning film stack; and
removing the second sacrificial layer.

17. The method of claim 16, wherein the second sacrificial layer comprises a high temperature oxide layer.

18. The method of claim 16, wherein the removing the patterning film stack includes using wet etching.

19. The method of claim 16, wherein the patterning further comprises:
disposing a cap on the first sacrificial layer prior to disposing the patterning film stack; and
removing the cap following the patterning the plurality of trench isolation regions.

20. The method of claim 11, wherein the disposing planarization includes using at least one of bottom anti-reflection coating (BARC) material, resist, or silicon dioxide.

21. The method of claim 11, wherein the flash memory is one of NAND flash memory or NOR flash memory.

* * * * *